(12) United States Patent
Sebastiano et al.

(10) Patent No.: US 8,174,416 B2
(45) Date of Patent: May 8, 2012

(54) AUTOMATIC COMMON-MODE REJECTION CALIBRATION

(75) Inventors: Fabio Sebastiano, Eindhoven (NL); Lucien Johannes Breems, Eindhoven (NL); Raf Lodewijk Jan Roovers, Wommelgem (BE)

(73) Assignee: NXP B.V., Eindhoven (NL)

( * ) Notice: Subject to any disclaimer, the term of this patent is extended or adjusted under 35 U.S.C. 154(b) by 143 days.

(21) Appl. No.: 12/679,484

(22) PCT Filed: Sep. 15, 2008

(86) PCT No.: PCT/IB2008/053723
§ 371 (c)(1),
(2), (4) Date: Mar. 23, 2010

(87) PCT Pub. No.: WO2009/040697
PCT Pub. Date: Apr. 2, 2009

(65) Prior Publication Data
US 2010/0201551 A1    Aug. 12, 2010

(30) Foreign Application Priority Data

Sep. 28, 2007 (EP) .................... 07117546

(51) Int. Cl.
*H03M 1/06* (2006.01)
*H03M 3/00* (2006.01)

(52) U.S. Cl. ...................... 341/118; 341/143

(58) Field of Classification Search .............. 341/118, 341/120, 143
See application file for complete search history.

(56) References Cited

U.S. PATENT DOCUMENTS

| 5,329,281 A | * | 7/1994 | Baumgartner et al. | ....... 341/139 |
| 5,459,679 A | | 10/1995 | Ziperovich | |
| 5,870,051 A | * | 2/1999 | Warburton et al. | ........... 341/155 |
| 6,603,416 B2 | * | 8/2003 | Masenas et al. | .............. 341/120 |

(Continued)

FOREIGN PATENT DOCUMENTS

JP    11-274929 A    10/1999

(Continued)

OTHER PUBLICATIONS

Yazicioglu, R.F., et al; "A 60 μW 60 nV/ Hz Readout Front-End for Portable Biopotential Acquisition Systems"; ISSCC 2006 pp. 56-57, 10 PGS. As Reprinted (2006).

(Continued)

*Primary Examiner* — Howard Williams

(57) ABSTRACT

The present invention relates to a circuit and a method for automatic common-mode rejection calibration in a differential conversion system and unbalance compensation for balancing the operation point of a circuit in the signal path and for enhancing the common-mode rejection. The circuit for automatic common-mode rejection calibration in a differential conversion system comprises an analog input stage for an analog input signal (101), an analog-digital-converter (106) for converting an analog signal (107) into its digital representation (108), a digital block (105) arranged to adapt said digital representation (108) of a portion of a DC offset of said analog input signal (101) in accordance with whether said analog input signal (101) is in a predetermined input range of said analog-digital-converter (106), and a digital-analog-converter (103) arranged in a feedback path (102) from said digital block (105) to subtraction means (111) of said analog input stage for converting a digital signal (104) into an analog output signal (109), wherein said analog output signal (109) is subtracted from said analog input signal (101) resulting in said analog signal (107).

20 Claims, 7 Drawing Sheets

U.S. PATENT DOCUMENTS

| | | | |
|---|---|---|---|
| 7,009,541 B1 * | 3/2006 | Nguyen | 341/143 |
| 2004/0227567 A1 | 11/2004 | Llewellyn | |
| 2007/0013440 A1 | 1/2007 | Chen et al. | |
| 2007/0182606 A1 * | 8/2007 | Iorgulescu | 341/120 |

FOREIGN PATENT DOCUMENTS

| | | |
|---|---|---|
| WO | 2006/047473 A2 | 5/2006 |

OTHER PUBLICATIONS

Ng, K. A., et al; "A CMOS Analog Front-End IC for Portable EEG/ECG Monitoring Applications"; IEEE Trans. on Circuits and Sytems-I; vol. 52, No. 11; pp. 2335-2347 (Nov. 2005).

Martins, R., et al; "A CMOS IC for Portable EEG Acquisition System"; IEEE Trans. on Instrumentation and Measurement; vol. 47, No. 5; pp. 1191-1196 (Oct. 1998).

Colonna, V., et al; "A 10.7MHz Self-Calibrated SC Multibit 2ND-Order Bandpass [Sigma]-[Delta] Modulator"; IEEE Solid State Circuits Conference, Florence, Italy, pp. 575-578 (Sep. 2002).

Guo, Haidong, et al; "A Low-Power Low-Noise Sensor IC"; Microelectronics and Electron Devices, IEEE Workshop, Boise, ID, pp. 60-63 (Apr. 2004).

International Search Report for International Patent Application PCT/IB2008/053723, Jun. 19, 2009, Published As WO 2009/040697 A3.

Medical electrical equipment—Part 2-51: Particular requirements for safety, including essential performance, of recording and analysing single channel and multichannel electrocardiographs, International Electrotechnical Comm. Std. IEC-60 601-2-51; 2003.

R. R. Harrison and C. Charles; "A low-power low-noise CMOS amplifier for neural recording applications," IEEE Journal of Solid-State Circuits, vol. 38, No. 6, pp. 958-965, Jun. 2003.

J. Johansson, H. Neubauer and H. Hauer; "A 16-bit 60 μW multi-bit ΣΔ modulator for portable ECG applications," in ESSCIRC, 2003, pp. 161-164.

R. F. Yazicioglu, P. Merken and C. V. Hoof; "Effect of electrode offset on the CMRR of the current balancing instrumentation amplifiers," in PhD Research in Microelectronics and Electronics; Jul. 2005, pp. 35-38.

J. Markus, J. Silva and G. C. Temes; "Theory and applications of incremental ΔΣ converters," IEEE Transaction on Circuits and Systems-I, vol. 51, No. 4, pp. 678-690, Apr. 2004.

B. H. Leung and S. Sutarja; "Multibit Σ-Δ A/D converter incorporating a novel class of dynamic element matching techniques,"; IEEE Transaction on Circuits and Systems-II, vol. 39, No. 1, pp. 35-51; Jan. 1992.

M. A. P. Pertijs and J. H. Huijsing; "A sigma-delta modulator with bitstream-controlled dynamic element matching," in ESSCIRC, Sep. 2004; pp. 187-190.

* cited by examiner

AUTOMATIC COMMON-MODE REJECTION CALIBRATION

FIELD OF THE INVENTION

The present invention relates to a circuit and a method for automatic common-mode rejection calibration and unbalance compensation, e.g. for balancing the operation point of a circuit in a signal path and enhancing the common-mode rejection.

BACKGROUND OF THE INVENTION

Biopotential reading systems are used to electronically acquire electric signals from human body, such as heart signals as an electrocardiogram (ECG) and brain activity as an electroencephalogram (EEG). These systems can be used in any biopotential acquisition system, not only as ECG or EEG, but also in electromyography (EMG). They are also needed in different applications, including Body Area Networks (BANs). However, to be embedded in sensor nodes for such a power constrained application as for BANs, special techniques should be employed to meet special requirements such as relating to the power.

An ECG illustrates the electrical activity of the heart over time. Analysis of the various waves and normal vectors of depolarization and depolarization yields important diagnostic information. An EEG represents electrical signals from a large number of neurons and thus illustrates the electrical activity of the brain. EMG is a technique for evaluating and recording physiologic properties of muscles at rest and while contracting. EMG is performed using an instrument called an electromyograph that detects the electrical potential generated by muscle cells when these cells contract, and also when the cells are at rest.

There are two major issues in the design of front-ends for these systems: firstly, dealing with a differential DC offset superimposed on a much smaller useful signal and secondly, obtaining a high common-mode rejection. The first effect is due to electrochemical potentials at the interface between the skin and the electrodes used to sense the signals; the latter characteristic is required in order to reject strong interferers such as main signals coupled to human body.

The DC offset or DC component, respectively, in the differential signal introduces two major problems. Firstly, if only a low supply is available, it is not possible to amplify the differential signal before the DC is eliminated. As this DC offset $V_{dm,DC}$ can be as high as ±300 mV, amplification by a factor of four will lead to the requirement of a voltage supply higher than 1.2 V.

Secondly, the presence of a high DC component brings an unbalance in the operation point of any circuit in the signal path. Thus, if a symmetrical circuit is used to reduce the effect of the common-mode, the bias point of the two halves of the circuit will be different due to the DC difference of the input signal. As it will be clarified in the following, this unbalance degrades the common-mode rejection. This unbalance cannot be eliminated by the usual techniques used to improve the common-mode rejection ratio (CMRR), as chopping. The reason is, that the unbalance is embedded in the differential signal and it would be chopped with it. This problem is described, for example, in R. F. Yazicioglu, P. Merken, R. Puers, and C. V. Hoof, "A 60 μW 60 nV/√Hz readout front-end for portable biopotential acquisition systems," in ISSCC, February 2006, pp. 56-57. The CMRR of a differential amplifier measures the tendency of the device to reject input signals common to both input leads. A high CMRR is important in applications where the signal of interest is represented by a small voltage difference between two (possibly large) voltages. Accordingly, CMRR is a very important specification as it indicates how much of the common-mode signal will appear in the measurement. The value of the CMRR often depends on signal frequency as well, and can be specified as a function thereof CMRR is important in systems where noise is coupled in the same manner on both input leads of a differential circuit. It is very common in case of electromagnetic interference from the main or nearby electronic equipment.

Common solutions are disclosed, for example, in K. A. Ng and P. K. Chan, "A CMOS analog front-end IC for portable EEG/ECG monitoring applications," in IEEE Transaction on Circuits and Systems-I, vol. 52, no. 11, pp. 2335-2347, November 2005, and R. Martins, S. Selberherr, and F. A. Vaz, "A CMOS IC for portable EEG acquisition system," in IEEE Transaction on Instrumentation and Measurement, vol. 47, no. 5, pp. 1191-1196, October 1998. These solutions make use of high pass filtering of the signal. As the differential DC component $V_{dm,DC}$ at the input contains no information but it is due only to parasitic effects, it can be eliminated without loss of information content. The required filter should have a high pass response with a lower cut-off smaller than the lower bandwidth limit of an ECG signal, i.e. 0.05 Hz. If very particular techniques are not used, the very low frequency singularities of the filter bring problems of integrability. Another disadvantage of the filter solution is a very slow startup and slow response to abrupt variations of $V_{dm,DC}$ caused for example by motional artifacts. The latter problem may be overcome by storing the DC circuit conditions before the disturbance and resetting them automatically after the disturbance. For the startup this approach is invalid as the value of the signal DC offset is unknown and waiting times of more than 20 seconds are introduced. This can be an excessive overhead if the system is used for sensing the heartbeats for only a few minutes. A second possibility is the implementation of a high-resolution analog-digital-converter (ADC), which converts both DC and AC components of the input signal and directly shifts the filtering problem to the cascaded digital logic. However, such circuitry is not optimized in terms of power, since the DC offset is treated as useful signal, increasing the required resolution and the power consumption.

SUMMARY OF THE INVENTION

It is an object of the present invention to improve the balancing of the operation point of a circuit in the signal path. It is a further object of the present invention to enhance the CMRR.

At least one of the objects is solved by a circuit for automatic common-mode rejection calibration in a differential conversion system in accordance with claim 1.

Accordingly the circuit comprises an analog input stage for an analog input signal, an analog-digital-converter for converting an analog signal into its digital representation, a digital block arranged to adapt said digital representation of a portion of a DC offset of said analog input signal in accordance to whether said analog input signal is in a predetermined input range of said analog-digital-converter, and a digital-analog-converter arranged in a feedback path from said digital block to subtraction means of said analog input stage for converting a digital signal into an analog output signal, wherein said analog output signal is subtracted from said analog input signal resulting in said analog signal.

Further, at least one of the objects is solved by a method for automatic common-mode rejection calibration in a differential conversion system in accordance with claim 15.

Accordingly, the method comprises the steps: converting an analog signal into a digital representation, adapting said digital representation of a portion of a DC offset of said analog signal in accordance to whether said analog signal is in a predetermined input range of an analog-digital-converter and to compensating said DC offset, and converting said digital representation of said portion of said DC offset into an analog representation of said portion of said DC offset, subtracting said analog representation of said portion of said DC offset from an analog input signal resulting in said analog signal.

The circuit of the invention is especially useful for common-mode rejection and unbalance compensation in a biopotential acquisition front-end according to claim 14.

Both, the circuit and the method, share the same advantages. Some advantages are listed below and will also be described in more detail in connection with the embodiments of the present invention.

By storing the calibration signal as a calibration sequence of finite length and reading out the calibration sequence periodically, memory space for storing and processing time can be saved.

By storing merely an average value of said calibration signal and producing the calibration signal from said average value having said average value, a fast processing time can be achieved and the need of expensive memory space can further be reduced.

By implementing the analog-digital-converter as sigma-delta-converter, an average value of said calibration signal can simply be extracted by running said sigma-delta-converter as an incremental converter in the calibration mode.

By means of a second sigma-delta-converter and producing said calibration signal from said average value with the sigma-delta-converter together with said second sigma-delta-converter, both using said average value as input signal, wherein said calibration signal is comprised of an output of said sigma-delta-converter and an output of said second sigma-delta-converter and by using an actual output of said differential conversion system for switching between said output of said sigma-delta-converter and said output of said second sigma-delta-converter a quasi-pseudo-random calibration signal can be produced. This process is also referred to as individual level averaging (ILA). A further advantage of the implementation of ILA is that a large part of noise will be averaged out and thus less quantization noise is obtained. ILA is a possible algorithm that can be implemented to improve the performance of the digital sigma-delta-modulator. Also other algorithms such as group level averaging (GLA) and partial data weighted averaging (partial DWA) can be implemented.

A simple averaging procedure can be applied to compensate a common-mode signal in the output of said differential conversion system by switching of said differential conversion system between at least two unbalanced states, wherein the two unbalanced states are introduced by purpose into said differential conversion system, by means of said calibration signal that is adapted to compensate said common-mode signal by averaging. In a certain embodiment, an approach to this is to change the balance of the circuit by modulating impedances at certain points of the circuit. It is to be noted that the unbalance of the differential circuit can be generated also in other ways. In other word, the way of unbalance presented in the following is just a particular unbalance. A person skilled in the art will surely find equivalent other ways. That is, other ways which enable a suitable modulation of the unbalance of the differential circuit, such a technique can still be applied.

Accordingly, in one embodiment the balancing of the operation point of said differential conversion system is performed by modulating impedances of two amplification branches in a differential amplification stage of said differential conversion system with said calibration signal in order to improve common-mode rejection. In general, the unbalance of the differential circuit can be generated e.g. as will be presented in connection with the detailed description of the embodiments further below.

Preferred embodiments of the invention are defined in the dependent claims.

It shall be understood that the circuit and the method of the present invention have similar and/or identical preferred embodiments as defined in the dependent claims.

BRIEF DESCRIPTION OF THE DRAWINGS

These and other aspects of the invention will be apparent from and elucidated with reference to the embodiments described hereinafter. In the following drawings.

DETAILED DESCRIPTION OF EMBODIMENTS

Figure 1:
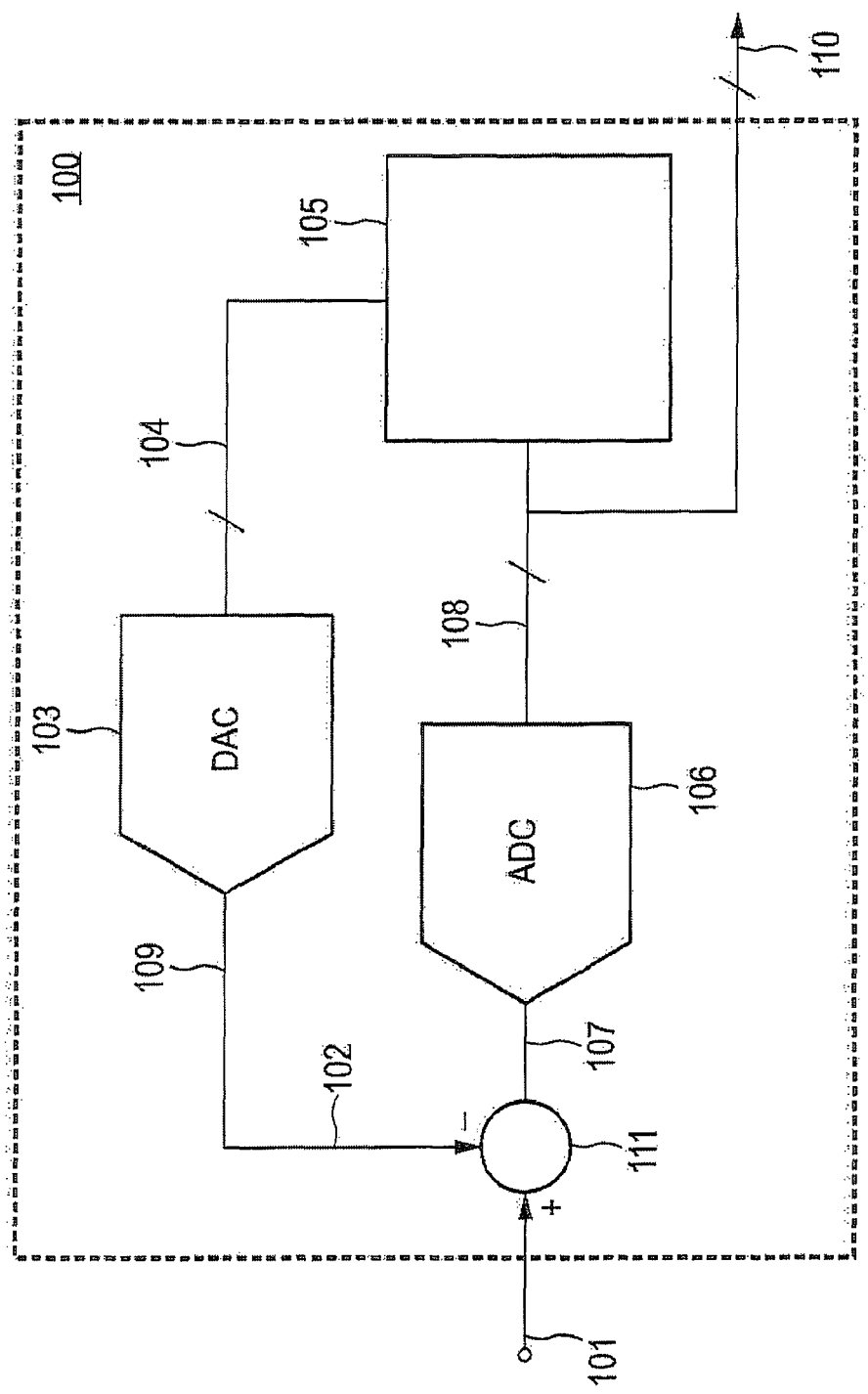
FIG. 1 shows a block diagram of a loop for DC offset compensation according to an embodiment of the present invention.

FIG. 1 shows a block diagram of a loop 100 for DC offset compensation according to a first aspect of the present invention. In short, by the arrangement an approximation of the DC offset $V_{dm,DC}$ of an analog input signal 101 is generated in the digital domain and subtracted in the analog domain from the input signal 101. This operation has proven to be very power efficient as the design can exploit the substantially static nature of $V_{dm,DC}$ and use slow circuitry. When a significant change of the DC offset in the input signal 101 occurs, it can be sampled again. It is noted that the waiting time is much smaller compared to the time constants of a high pass filter with low cut-off.

The basic idea resides in the perception that the DC component or DC offset, respectively, can be partly discriminated from the useful part of the input signal 101 without looking at the frequency behavior. It is simply approximated as the part of the input signal 101, which occupies the most significant bits of a full-scale analog-digital (A/D)-converter. With this assumption, it is possible to eliminate the most part of the DC offset, such that only a little fraction of it remains, i.e. residual DC fraction, in the signal supplied to the A/D-converter as input. The residual DC fraction will be in the order of magnitude of the AC component, i.e. the useful part of the input signal, amplitude. Accordingly, the remaining residual DC fraction will have less effect on power and common-mode rejection of the subsequent connected circuits. Moreover, the sampling of the approximation of the DC offset allows the system to perform an automatic calibration to further increase the common-mode rejection, which will be explained in the following.

In the shown embodiment, the DC offset compensation is implemented by cascading an analog-digital-converter (ADC) 106 with a digital block 105, which is configured to determine an overload of the ADC 106 and to approximate or to adapt a digital representation of the DC offset. A digital-analog-converter (DAC) 103 is located in a feedback path between an output of the digital block 105 and an input of the ADC 106.

In a certain embodiment the ADC 106 of the described architecture is implemented as a sigma-delta-converter ($\Sigma\Delta$-converter, for short). The sigma-delta modulation ($\Sigma\Delta$-modulation, for short), also sometimes called delta-sigma modulation ($\Delta\Sigma$-modulation, for short), is a well-known arrangement which can be used for analog-digital or digital-analog conversion.

In FIG. 1, an analog subtraction node 111 at the input of the system is arranged for subtraction of the analog input signal 101 and the output 109 of the DAC 103, which is fed with a digital representation of the approximated DC offset 104. That digital representation is produced by the digital block 105 reflecting an actual overload of the ADC 106. The digital block 105 dynamically adapts the digital representation of the DC offset until the effective input signal seen by the ADC 106 is in the correct input range, i.e. the ADC 106 is no longer overloaded. The direction of this approximation process can be derived or recognized from the overload situation of the ADC 106. In this way the resulting DC compensated input signal 107 at the input of the ADC 106 is successively adapted to be in the correct input range, in steady state.

For example, if the input signal 107 increases due to an increased DC offset level, the maximum input range (ADC $\eta$, FIG. 2) of the ADC 106 will be exceeded, causing the ADC 106 to be overloaded. The digital block 105 is arranged to determine the overload situation and to generate a higher digital word, which represents a major part of the DC offset, for the DAC 103. Thus, the output of the digital block 105 is adapted, i.e. in this case increased, until the input of the ADC 106 is back in the correct or suitable, respectively, input range of the ADC 106.

Figure 2:
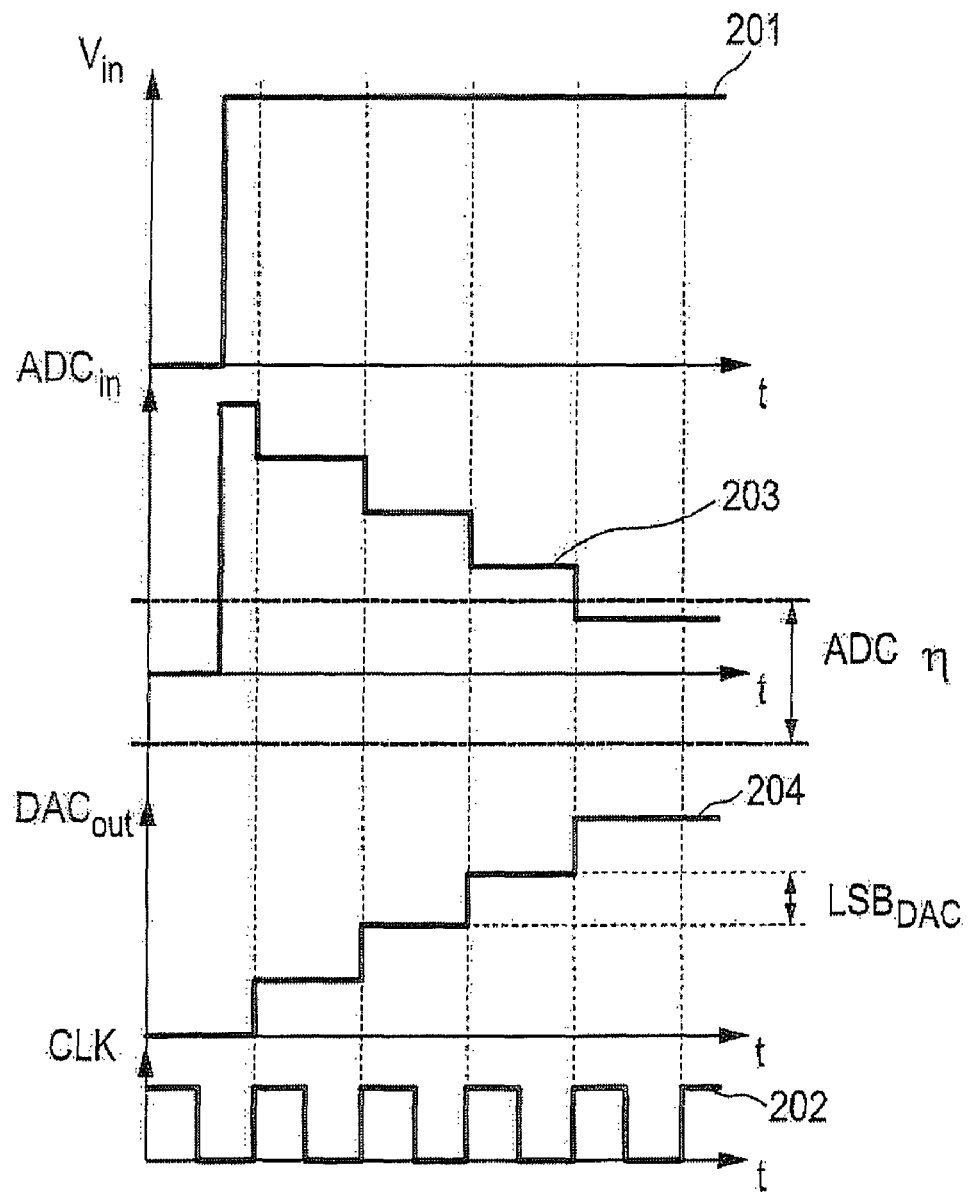
FIG. 2 shows time waveforms in the system of FIG. 1 in case of a positive step of the DC offset in the input signal.

The working of the system will be explained in more detail by way of an example with the help of FIG. 2, in which waveforms at different points of the system in case of a positive step $V_{in}$ 201 are shown. At each clock (CLK) cycle 202, the digital block 105 determines if the ADC 106 is overloaded when looking at the digital ADC output 108. When an overload is detected, i.e. the input signal 107 of the ADC 106 is outside the ADC input range (ADC $\eta$), it drives the DAC 103 in such a way to bring $ADC_{in}$ 107, 203 back into the ADC input range (ADC $\eta$). One advantage of this solution is that the resolution of the ADC 106 can be kept at minimum. In other words, the dynamic range of the converter is constrained only by the useful signal and not by the DC offset.

The DAC 103 can work at very low frequencies, as it has only to deal with the DC offset and its drift. Accordingly, it is worth noting that the clock 202 shown in FIG. 2 is not necessarily the sampling clock of the ADC 106. The clock frequency of the ADC 106 is determined by the bandwidth of the useful part of the input signal 101. It is possible to derive the clock for the DAC 103 from the system clock such that its period equals any integer multiple of the sampling clock period, e.g. according to the desired response time in case of abrupt DC offset variation. The resulting $DAC_{out}$ 204 is also shown in FIG. 2 with indication of the least significant bit ($LSB_{DAC}$) of the DAC 103.

In one particular embodiment, the ADC 106 of FIG. 1 is implemented as a $\Sigma\Delta$-converter with an effective resolution after decimation of a number of bits. Its output is a one-bit sequence which is fed to a digital circuit, which corresponds to the digital block 105 in FIG. 1, which determines the overload of the sigma-delta modulator. It goes without saying that different algorithms can be implemented in the digital block 105 for approximation of the DC offset, but also very simple ones are effective. In one embodiment, the number of zeros and/or ones in a specified time window are counted. To detect an overload of the sigma-delta-converter it is determined if the number of zeros and/or ones exceeds a predefined (threshold) parameter. The one bit output sequence of the sigma-delta-converter can be sent to a digital decimation filter as a representation of the useful signal while the output word of the digital block can be used as a digital representation of the DC baseline.

According to a second aspect of the present invention, it has been found that unbalances in symmetry of differential systems can be compensated for by introducing by purpose into the system at least two unbalanced states and by making the system work either in one unbalanced state or in the other one such that the unbalance, e.g. introduced by the residual DC offset, is averaged out. The switching into one of or between the unbalanced states is done by means of a control signal, which is herein called calibration signal.

In a first embodiment, the calibration signal is stored as calibration sequence q whose actual values define in which of the at least two unbalanced states the system is put in any particular instant. In a basic implementation, the calibration sequence q is a binary sequence comprised of two kinds of symbols each being associated with one of two different unbalanced states. It is noted that the calibration signal that determines the unbalanced state of the system can be designed to have a rate or frequency, respectively, much higher than the characteristic frequency of the system. If the introduced unbalances and the calibration sequence q are chosen in an appropriate way, the time average of the differential output results in a compensation of the introduced unbalances by means of the averaging. Methods to choose and to generate the right unbalance and the calibration sequence q are described in the following.

Preferably, the compensation is performed in the first block in the receiver chain in order to maximize the CMRR. Moreover, if the input impedance of the first block is made very high, it will better comply with biomedical instrumentation standards. For example, a buffer needed before the A/D-converter may be the point for compensation of the DC offset and the CMRR. In a particular embodiment, the ADC 106 (FIG. 1) is implemented as a sigma-delta-converter, where a continuous-time implementation for the sigma-delta-converter is used. The first transconductor of the sigma-delta-converter is also called operational transconductance amplifier (OTA) being a voltage-current-converter, which merges together the functions of the buffer and of the first integrator in the modulator, leading to a lower power consumption.

Figure 3:
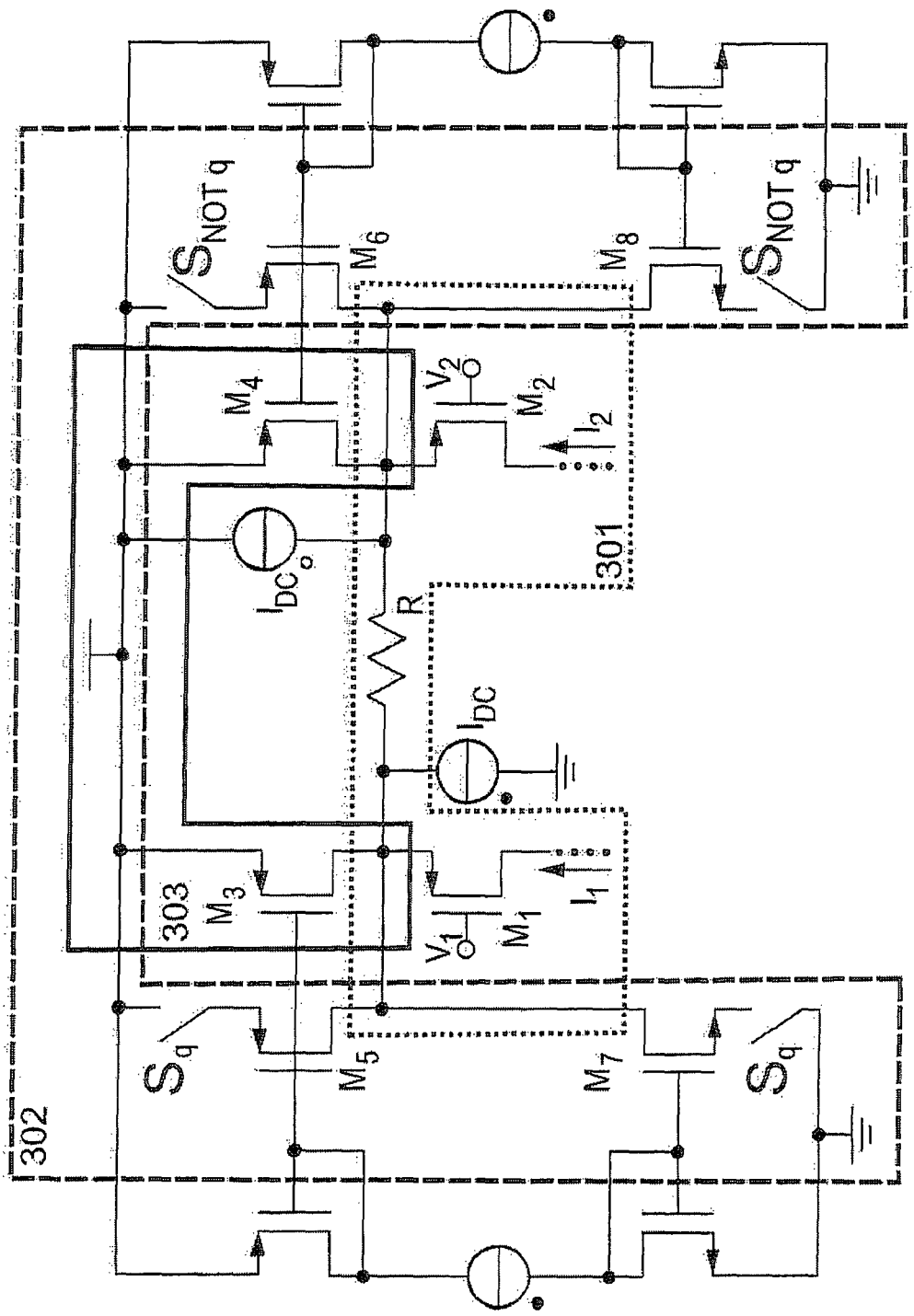
FIG. 3 shows the input part of a transconductor used in a first integrator of a sigma-delta-converter according to an embodiment of the present invention.

A schematic view of the input section of the afore-mentioned transconductor to be used in the first integrator of the sigma-delta-converter is shown in FIG. 3. The input of the transconductor is at the gates of a differential pair $M_1$-$M_2$, indicated as a differential block 301, as to obtain high input impedance. The input pair respectively the differential block 301 also shows a degeneration resistor R to accommodate a large input swing due to the DC offset. Neglecting the switches and transistors $M_5$-$M_8$, which are indicated as a switching block 302, the transistors $M_3$ and $M_4$, indicating a bias current supplying block 303, provide bias current for the differential block 301, while the two current sources $I_{DC}$ are the output of the DAC 103 shown in FIG. 1. This current $I_{DC}$ causes a DC voltage drop across R inside the differential block 301 equal to the DC offset determined by the digital block 105: in this way the differential output current $I_0 = I_1 - I_2$ does not contain the DC offset and DC compensation is performed.

The unbalancing effect of $V_{dm,DC}$ representing the DC voltage in differential mode will be explained, in short. Considering only DC components of differential and common mode, one obtains $$V_1 = V_{cm,DC} + V_{dm,DC}/2, \quad V_2 = V_{cm,DC} - V_{dm,DC}/2$$

$$I_{DC} \cong V_{dm,DC}/R$$

$$V_{S1} = V_{cm,DC} + V_{dm,DC}/2 + V_{GS1}, \quad V_{S2} = V_{cm,DC} - V_{dm,DC}/2 + V_{GS2},$$

where $V_{cm,DC}$ represents the DC voltage in common mode and $V_{GS}$ and $V_S$ represent the gate-source voltage and the source voltage, respectively. The difference of the DC voltages at the sources of $M_1$ and $M_2$ is determined only by the DC offset if the circuit is sized as usual so that the respective gate-source voltages are equal: $V_{GS1} = V_{GS2}$.

The difference in DC voltages of the sources of $M_1$ and $M_2$ causes a different drain-source voltage between $M_1$ and $M_2$, $M_3$ and $M_4$, with a consequent unbalance of their output conductance. It can be proven that the CMRR of this circuit can be approximated as $$CMRR^{-1} = \frac{\Delta g_3}{g} - \frac{2\Delta g_1}{g_m},$$

where $\Delta g_1$ and $\Delta g_3$ are the unbalance of output conductance of transistors in the two halves of the circuit, $g = R^{-1}$ and $g_m$ is the transconductance of $M_1$ and $M_2$. Introducing the dependence of output conductance from drain-source voltage, one gets $$CMRR^{-1} \cong \left( \frac{g_3}{2gV_{A3}} + \frac{g_1}{g_m V_{A1}} \right) \cdot V_{dm,DC},$$

where $V_{A1}$ and $V_{A3}$ are constant voltages dependent on the dimensions of the transistors $M_1$ to $M_4$.

In a further development, a better CMRR is obtained by increasing the output resistances of the transistors or by avoiding the variation of the source-drain voltage with suitable circuit techniques. These techniques require a certain voltage headroom and the implementation cannot be possible with low voltage supply due to the required input range. It has been found that the CMRR depends on the impedance seen at the sources of $M_1$ and $M_2$ inside the differential block 301. Hence, an unbalance of these impedances generates a certain common-mode-to-differential amplification. Thus, by modulating this impedance the unbalance of the common-mode-to-differential gain of the first stage can be modulated. In other words, if the unbalance is varied continuously between a positive and a negative direction, the unbalance will be averaged to zero.

In the embodiment shown in FIG. 3, transistors $M_5$-$M_8$ act as a switching block 302: By means of the calibration sequence q the switches, denoted with $S_q$ and $S_{NOT\,q}$, and thus the unbalances of the system on one side or the other side can be controlled. Accordingly, a corresponding positive or negative output differential current is obtained due to the common-mode at the input. If the calibration sequence q is chosen appropriately, the average of the differential current due to common-mode at the input is zero or, equivalently, the common-mode-to-differential transfer between input and output of the circuit is zero, which implies infinite CMRR. The input parameters in FIG. 3 into the differential block 301 are the voltages $V_1$ and $V_2$ and the output parameters out of the differential block 301 are the currents already mentioned as $I_1$ and $I_2$ according to the embodiment of the present invention.

Figure 4:
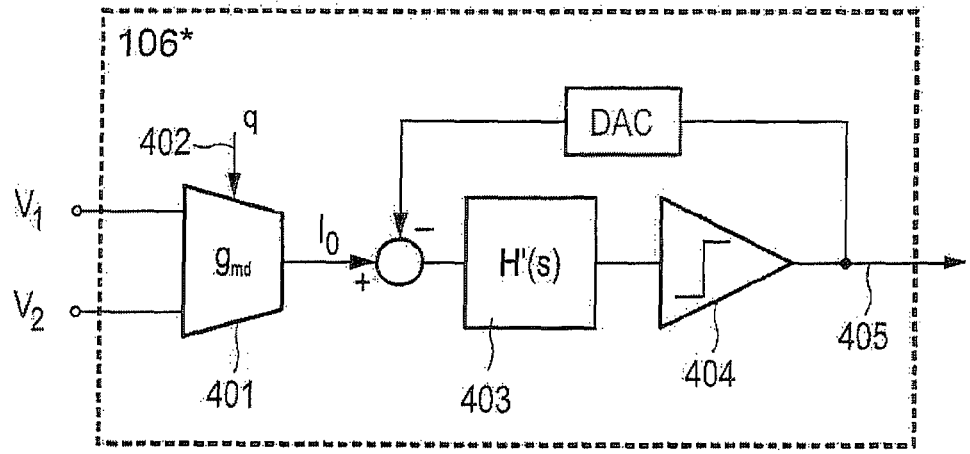
FIG. 4 shows a block diagram of the sigma-delta-converter with CMRR compensation in conversion mode according to the embodiment of FIG. 3.

The resulting sigma-delta architecture is shown in FIG. 4. The configuration shown is the conversion mode according to one embodiment of the present invention. The block diagram shown in FIG. 4 represents a certain configuration of the ADC 106 in FIG. 1, where the system is in conversion mode. Accordingly, the circuit in FIG. 3 may be implemented in block 401, i.e. in the input transconductor. The input transconductor 401 with differential-to-differential gain $g_{md}$ receives the calibration sequence q 402, e.g. with a bit rate equal to the converter oversampling rate, that modulates the common-mode-to-differential gain. The loop response of the complete sigma-delta converter is $H(s) = H'(s)\,g_{md}$. In FIG. 4, $H'(s)$ 403 is used in order to highlight the use of the first transconductor 401.

Now, a procedure for obtaining the calibration sequence q for CMRR compensation is described. The procedure needs no additional hardware other than the sigma-delta architecture already used for conversion of the input signal. The input transconductor can be modeled with the following input-output relation:

$$I_{ud} = g_{md} \cdot V_d + (g_{mc} + q \cdot \Delta g_{mc}) \cdot V_c,$$

where $I_{ud}$ is a differential output current, $g_{md}$ is the differential-to-differential transconductance, $g_{mc}$ is the common-mode-to-differential transconductance and $\Delta g_{mc}$ is its variation due to the switching action controlled by the calibration sequence q 402 explained before. Here it is assumed that q can take values in $\{-1\}$. But it is also possible in other implementations to use other values, such as for example $\{0, 1\}$.

The total common-mode-to-differential transconductance can be defined as:

$$G_c = g_{mc} + q \Delta g_{mc}.$$

The circuit is designed in order that $G_c$ is either positive or negative depending on the value of q. Thus it is possible to obtain an average $G_c$ equal to zero: this is equivalent to infinite CMRR.

The average value $\bar{q}$ of q to obtain infinite CMRR at DC is given by:

$$\bar{q} = -g_{mc}/\Delta g_{mc} = -1/\alpha,$$

wherein the negative inverse of $\bar{q}$ is hereby defined as a parameter $\alpha$.

Figure 5:
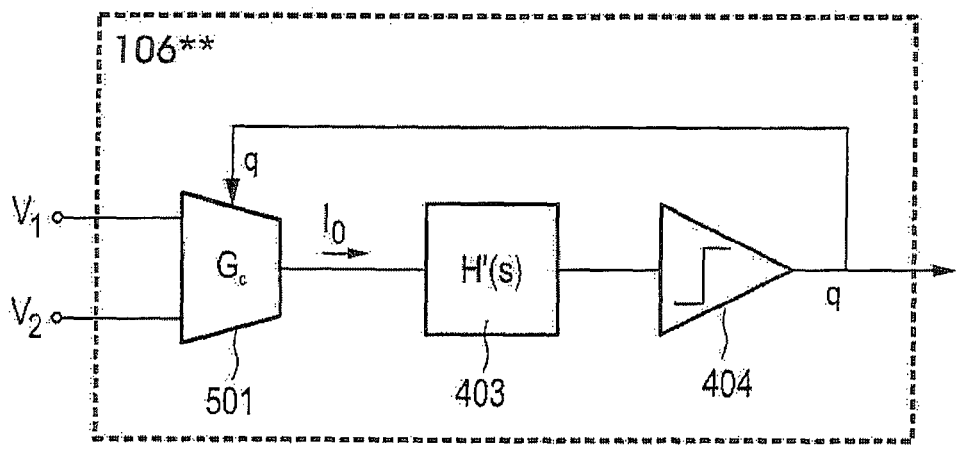
FIG. 5 shows a block diagram of the circuit in calibration mode according to the embodiment of FIG. 4.

It is noted that this value depends on the particular value of $V_{dm,DC}$ as $g_{mc}$ depends on it. In order to obtain the right value for $\bar{q}$ the circuit of FIG. 5 according to the embodiment is used. The same circuit of FIG. 4 according to the embodiment is adopted but the feedback is closed in a different way. Accordingly, the configuration of FIG. 5 can be called calibration mode, in which no signal conversion takes place. In contrary, as mentioned above the configuration of FIG. 4 is called conversion mode, in which signal conversion is performed. It should be noted that in FIGS. 4 and 5 the realization of the ADC 106 of FIG. 1 is shown, i.e. the systems 106*, 106** in FIGS. 4 and 5 are block diagrams of the ADC 106 in two different modes: conversion mode (106*, FIG. 3) and calibration mode (106**, FIG. 5).

In the following it will be explained how the calibration sequence q is obtained. In calibration mode (see FIG. 5) the input signal, i.e. the electrodes, are not directly connected to the input of the transconductor. The system must internally generate two voltages $V_1$ and $V_2$ such that:

$$V_1 = V_C + V_{dm,DC}/2 \text{ and } V_2 = V_C - V_{dm,DC}/2,$$

where $V_c$ is a predefined common-mode level. It has been found that the most accurate calibration can be obtained, if the common-mode level $V_c$ is equal to the DC voltage in common mode $V_{cm,DC}$. If this latter value is anyhow known, it should be used for fixing the value of the common-mode level $V_c$. However, if this value is unknown, any voltage in the input common-mode range of the circuit can be used. It is worth noting that the CMRR is approximately independent of the input common-mode level.

The system can easily generate a differential signal equal to $V_{dm,DC}$ because a digitization of its value is already present at the output of the digital block 105 of FIG. 1. The presence of this offset is necessary to put the system in the same unbalanced condition as it would be in conversion mode (FIG. 4). However, it is not possible to connect directly the real input as in that case the transconductor (FIG. 3; 401, FIG. 4; 501, FIG. 5) will produce an output current proportional to the differential signal much bigger than the offset due to $G_c$: the calibration would then be impossible. It is noted that the DC offset at the input will not produce a differential current because the system depicted in FIG. 3 is adopted to subtract the DC offset.

In one embodiment, in order to obtain the calibration sequence q for CMRR compensation in the system previously described, the system is run, in the calibration mode, with a calibration signal equal to the sigma-delta-comparator output. That is, the output of the comparator 404 is connected to the calibration node of the transconductor 401, as shown in FIG. 5.

Figure 6:
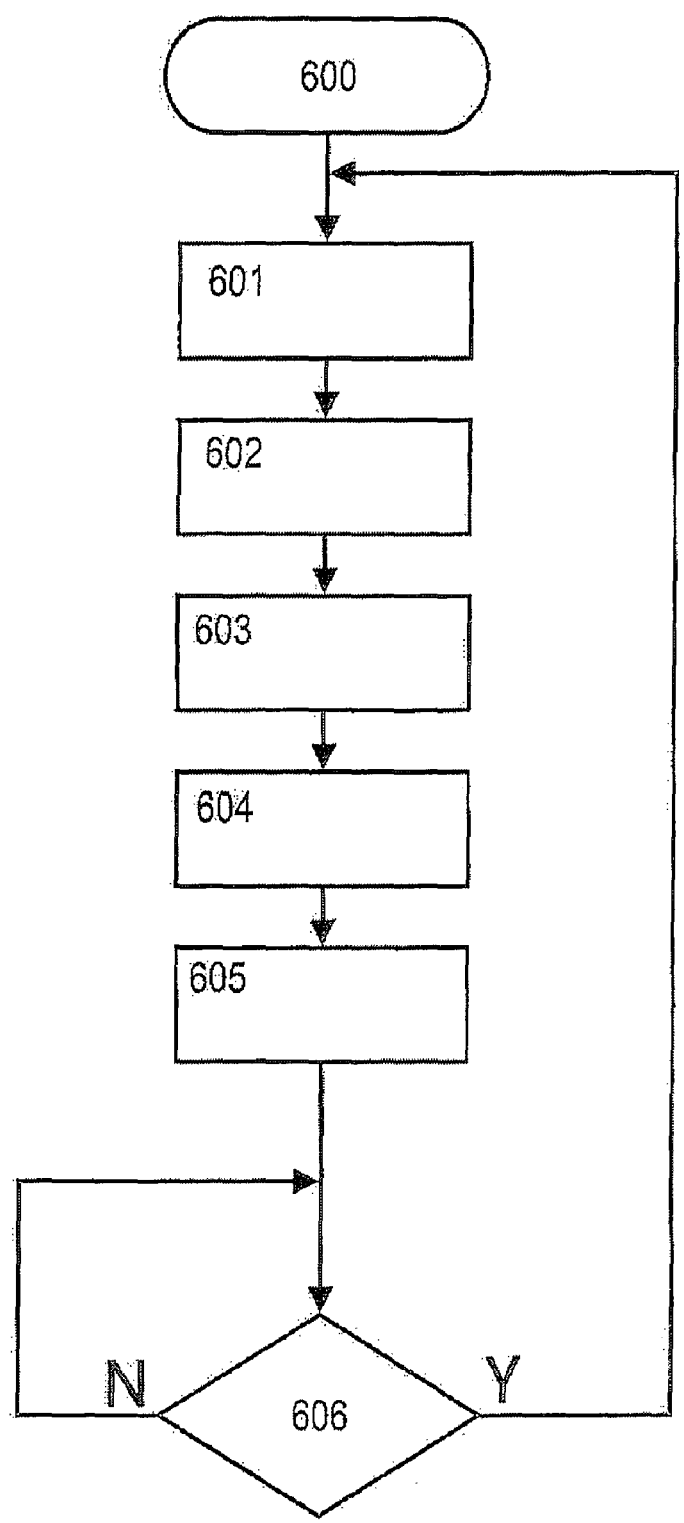
FIG. 6 shows a flowchart illustrating how a calibration signal is obtained for CMRR compensation according to an embodiment of the present invention.

The complete system works in the following way as illustrated in the flow chart of FIG. 6 according to the embodiment. Starting with step 600, FIG. 6 shows how the calibration sequence q is obtained for CMRR compensation.

In step 601, the system is connected to the input electrodes and the ADC 106 is put in the configuration of FIG. 4, i.e. the conversion mode. An analog input signal 101 is supplied to the conversion system.

Then, in step 602, the DC offset compensation loop 100 of FIG. 1 finds an approximation of the DC offset $V_{dm,DC}$. In this embodiment the DC compensation loop 100 of FIG. 1 operates as described in connection with FIG. 2. During step 602 the calibration sequence q is not fed to the circuit. It is noted that in situation the circuit can be put in either of the two unbalanced states or in a third state in which no unbalance is added, e.g. with all switches $S_q$ and $S_{NOT\ q}$ in FIG. 3 open. This is possible because no high CMRR is needed during this step, as no useful signal is generated but only a digital representation of $V_{dm,DC}$ is obtained. Approximating the DC offset, in step 602, comprises: sampling and digitizing the analog input signal 101, determining whether the analog input signal 101 is in the predetermined input range, successively adapting a digital representation of the DC offset, converting the digital representation of the DC offset into the DC compensation signal, feeding back the DC compensation signal to the analog input signal 101, and repeating the adapting of the digital representation of the DC offset until the analog input signal 101 is in the predetermined input range of the differential conversion system. At the end of step 602, when the DC compensation loop 100 is in steady state, the signal 104 substantially corresponds to a digital representation of an approximation of the DC offset ($V_{dm,DC}$) and can be used in the following steps.

In step 603, the conversion system is put in calibration mode, i.e. the ADC 106 of FIG. 1 is put in the configuration of FIG. 5 (ADC 106**), in order to obtain the required calibration sequence q. The input $V_1$ and $V_2$ of the input transconductor 501 in FIG. 5 are generated using for the value of $V_{dm,DC}$ the approximation obtained in step 602. The value of the common-mode level $V_c$ is chosen as discussed previously. The calibration sequence q is thus obtained in the following way: when the system is put in calibration mode, the signals $V_1$ and $V_2$ are generated as discussed previously and at the output of the comparator 404 the calibration sequence q is generated; as it is clear to those skilled in the art, according to the properties of sigma-delta-modulators, the sequence q generated during this step has the average value needed to maximize the CMRR of the transconductor. It can be understood that the sequence q is generated by the sigma-delta-modulator in such a way that the output of the transconductor is zero by averaging. In other word, the transconductor has an average common-mode-to-differential transconductance $G_c$ equal to zero.

The following step 604 comprises storing of the calibration sequence or bitstream q obtained in step 603.

Then, in step 605, the system is put back in conversion mode, i.e. the ADC 106 is put in the configuration of FIG. 4 (ADC 106*). In this step the calibration sequence q stored in step 604 is applied at the calibration input 402, to switch the transconductor by purpose between two predetermined unbalanced states in accordance with the second aspect of the present invention. During step 605 the effective conversion of the useful signal of the input signal is performed and a digital representation of the differential signal of the electrode is present at 110 (FIG. 1).

In step 606, the digital block 105 again monitors if a significant change in the DC offset $V_{dm,DC}$ occurs, i.e. if the ADC 106 (FIG. 1) is overloaded. If yes (Y) then a new compensation of the DC offset is performed and a new calibration sequence is generated by repeating the described procedure. That is, a new calibration sequence q will be generated for a new value of $V_{dm,DC}$. In other words, as soon as the digital block 105 detects a new overload situation of the ADC 106, which most likely is due to a change in the DC offset, a new compensation of the DC offset in accordance with the first aspect of the invention is performed and then a respective new calibration sequence q can be generated, as described above. As long as no change if the DC offset requires for compensation as well as recalibration the monitor step 606 is repeated (N branch of step 606).

It is worth noting that for enough high loop gain the value of $\bar{q}$ obtained in step 603 approaches that given for an infinite CMRR at DC previously described. The common-mode rejection during conversion, i.e. during step 605, is noise shaped in the same way like the quantization noise. The shape of the spectrum is determined by the loop filter transfer function H(s). In the signal bandwidth, where $|H(s)| \gg 1$, the common-mode rejection achieves the maximum value:

$$CMRR_{max} = |H(0)| V_c \alpha,$$

where α is a parameter previously defined as $\Delta g_{mc}/g_{mc}$. The maximum achievable performance is then limited by loop filter DC gain. The stability of the system in calibration mode (cf. FIG. 5) is the same than in the conversion mode (cf. FIG. 4), as the two configurations differ only in the feedback scaling coefficient, i.e. the loop gain in the two configurations differs only by a multiplicative coefficient which can be approximated as not frequency dependent. If the system is stable the sequence obtained at the output of the comparator 404 represents the calibration sequence q to be used in conversion mode.

The effect on the common mode can be explained as in the following. The calibration sequence q is the output sequence of the sigma-delta-converter: its spectrum will be composed by the wanted signal plus shaped quantization noise. In this case the wanted signal is a DC signal of value that was already given above for infinite CMRR at DC.

The average value of the calibration sequence will be a value that maximizes the CMRR and will be as close as possible to $-1/\alpha$. Thus q can be described as $-1/\alpha + q_e$, where $q_e$ is the shaped quantization noise.

When the calibration sequence q is used in the conversion mode circuit, the part of the output current of the transconductor due to a common-mode input tone $A_c \sin \omega_c t$ can be written as:

$$G_c A_c \sin \omega_c t = (g_{mc} + q\Delta_{mc})A_c \sin \omega_c t = g_{mc}\alpha q_e A_e \sin \omega_c t.$$

This means that the tone at $\omega_c$ disappears and some residual shaped spectrum due to common mode is present. In practice, depending on the DC loop gain in calibration mode, the tone at the output of the transconductor has a smaller magnitude than the value $g_{mc} A_c$ it would have with no calibration: the suppression of this tone is proportional to H(0).

The conversion mode circuit (cf. FIG. 4) is fed with a same sequence q taken from the calibration mode circuit (cf. FIG. 5) in the ideal case. The length of such a sequence should be enough to be supplied for all the conversion time. As one clearly wants to use the same circuit blocks for both calibration and conversion modes, the calibration sequence q must be stored during calibration and recalled for conversion.

In further developments of the system. two different approaches are possible to reproduce the calibration sequence q during conversion: In one embodiment, a portion of final length of the calibration sequence q generated with the procedure described above can be stored and used during conversion in a periodic fashion, i.e. periodically using a portion of final length of the calibration sequence q.

In another embodiment, the average value of the calibration signal respectively the calibration sequence q is extracted during the procedure previously described and later used to generate, i.e. reproduce, a new calibration sequence q with the same average to be used during conversion. This requires only slight modifications to the steps 603 to 605, described above.

The average of the calibration sequence q can be extracted by running the sigma-delta-converter 106** in FIG. 5 as an incremental converter during calibration. By adding a digital accumulator, which receives as input the calibration sequence q, the average of the calibration sequence q can be obtained. The system is left running until the required precision for $\bar{q}$ is reached: a longer time allows to obtain less quantization noise and to average out noise from the circuit. At the end of the conversion the digital accumulator will contain an approximation of $\bar{q}$. Then, during conversion (step 605, FIG. 6) the calibration sequence q is generated from the extracted average by using the output of an additional digital sigma-delta-modulator. It is worth noting that the additional digital sigma-delta-modulator is an additional component used to reproduce the calibration sequence q of step 603 (see FIG. 6), which is only represented by $\bar{q}$. That is, the additional sigma-delta-modulator has as input the average value $\bar{q}$ of the calibration sequence q stored during step 604.

In a further development, by use of a second additional digital sigma-delta-modulator noise is further averaged out and less quantization noise is obtained. Accordingly, individual level averaging (ILA) can be used to improve the performance of the digital sigma-delta-modulator.

Once the average value $\bar{q}$ is available in digital form, a pseudo-random calibration sequence q is to be generated to be fed to the transconductor (FIG. 3, 401 in FIG. 4) in conversion mode. This pseudo-random sequence should have a shaped quantization noise spectrum and an average $\bar{q}$. This can be accomplished using a second additional digital sigma-delta-modulator.

The calibration sequence q modifies the structure of the transconductor to unbalance it. The amount of such unbalance is very small as it has just to be enough to change the common mode gain which is much smaller than the differential gain. Anyhow some interaction between the unbalance and $g_{md}$ can be seen from circuit simulations. In conversion mode this effect causes the sequence q to interact with the signal. This interaction can bring to mixing of the shaped noise spectrum of the sequence q with the shaped noise spectrum of the output signal. This causes the folding back of quantization noise in the signal band decreasing the signal-to-noise ratio (SNR) of the converter. It is noted that this effect can be very small as the dependence of $g_{md}$ on the sequence q is very small in a well designed transconductor. Anyhow a cheap architectural solution to this problem can be found. It is based on the same approach of ILA used for multibit DACs or for chopping. The sequence q to be used must behave such that it averages independently on ones and zeros of the output sequence. This assures that no mixing occurs between the resulting calibration sequence and the output sequence.

Figure 7:
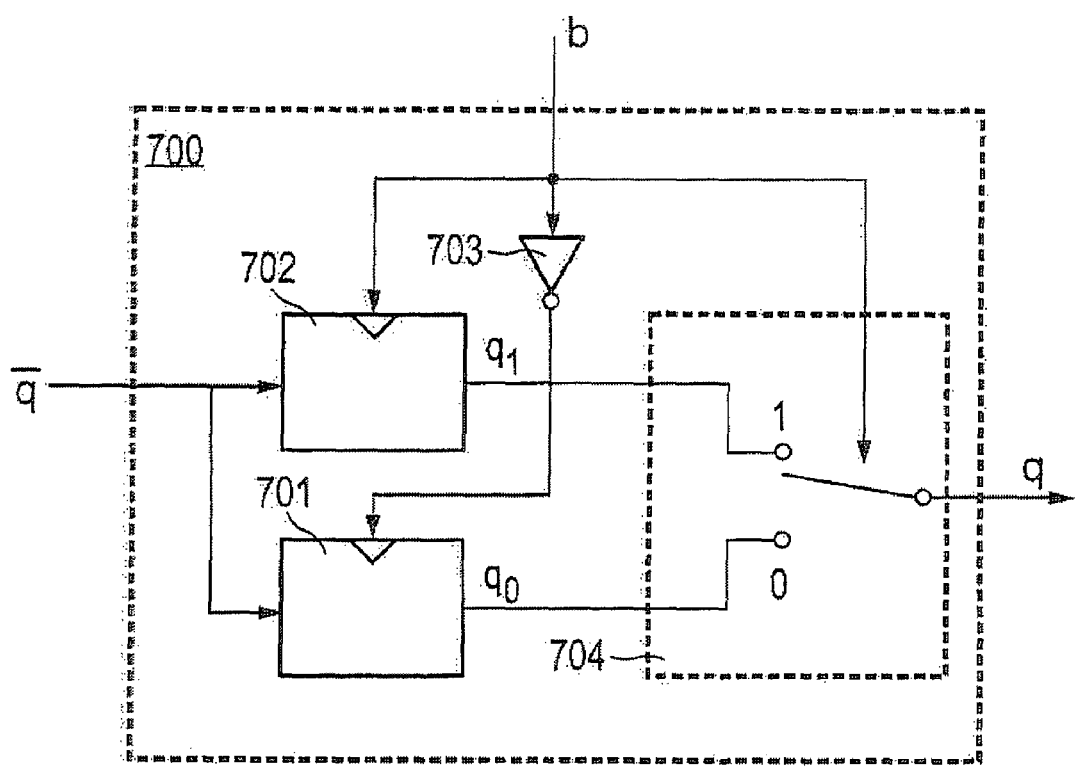
FIG. 7 shows an architecture for generation of the calibration signal according to an embodiment of the present invention.

The concept is now described with reference to FIG. 7 where a reproduction unit 700 for generation of the calibration sequence q from the stored average value $\bar{q}$ according to the further development is shown. There are the additional digital sigma-delta-modulators 701, 702 whose input is the value $\bar{q}$ obtained during the calibration mode. The two digital sigma-delta-modulators 701, 702 produce two independent pseudo-random sequences $q_0$ and $q_1$ having the same average $\bar{q}$. The control sequence b corresponds to the output of the global converter (106*), i.e. the output 405 of the system shown in FIG. 4. The digital sigma-delta-modulators 701, 702 are "clocked" by this control sequence b 705 and its negation provided by means of an inverter 703. Thus, both digital sigma-delta-modulators 701, 702 produce each a new value of the pseudo-random sequence when the input of its clock input is 1. The control sequence b is also used as a control signal of a multiplexer 704. Accordingly, an actual value of the sequence $q_0$ is used when b=0 and an actual value of the sequence $q_1$ is used when b=1. This simple arrangement assures that the new output sequence q will not produce intermodulation products if mixed with the control sequence b, as simulations have proven.

To show effects of different calibration sequences the following simulations have been performed. A couple of pseudo-random sequences $q_0$ and $q_1$ were produced feeding a second order digital modulator with a theoretical value of $\bar{q}$. As theoretical value the exact value of $\bar{q}$ which exactly compensates for the CMRR is meant. It is not obtained from the calibration mode circuit (see FIG. 5) to underline in this case only the effect of interaction between q and $g_{md}$. A conversion mode system has been implemented using a third order modulator with signal bandwidth equal to 1 kHz and oversampling ratio of 100. The simulations have been performed with a tone of 100 Hz as input differential signal and a 50 Hz tone as input common-mode signal. To emphasize the effect of parasitic mixing between the calibration sequence q and the sequence b the architecture of FIG. 4 was slightly modified moving the subtraction node before the transconductor 401; in this way the sequence b (modulator output) is directly multiplied by the sequence q through the input-output characteristics of the transconductor and the effect of this mixing are clearly visible.

Figure 8:
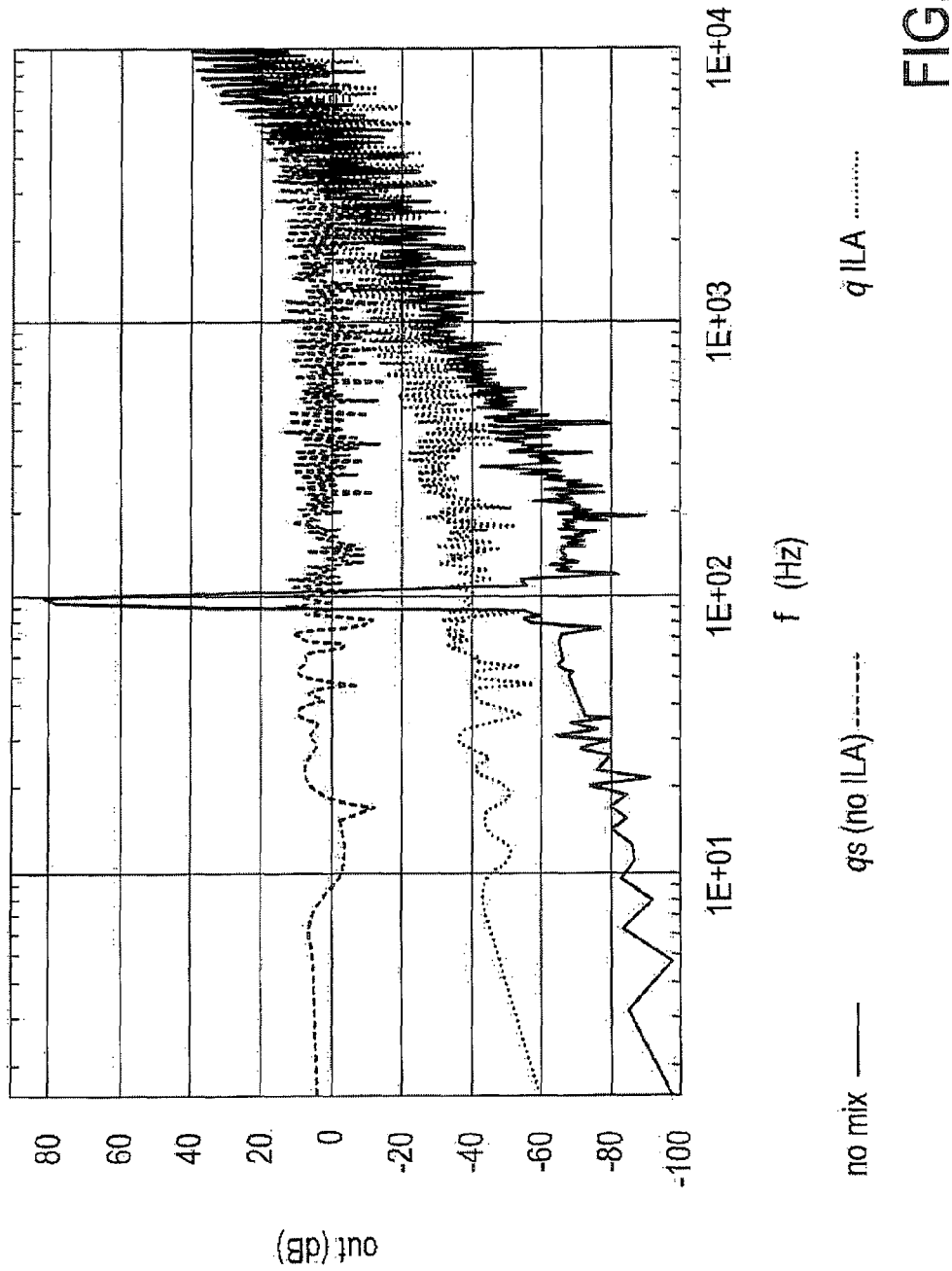
FIG. 8 shows simulation results of different methods for generating the calibration signal according to the embodiments of the present invention.

FIG. 8 illustrates simulation results of different methods for generating the calibration sequence q according to the third embodiment of the present invention. The simulations have been repeated in three cases: with an ideal transconductor (see solid line in FIG. 8), i.e. $g_{md}$ independent from q ($g_{md}=g_{md0}$)); with a transconductor with $g_{md}$ variations of ±1% dependent on the value of q ($g_{md}=g_{md0}(1+k\ q)$) when using the system for ILA depicted in FIG. 7 (see dotted line in FIG. 8); with a transconductor with $g_{md}$ variations of ±1% dependent on the sequence q and using a calibration sequence $q_s$ obtained from a single digital modulator, i.e. no ILA (see dashed line in FIG. 8). The common-mode tone is buried under noise level: in this case the average $\bar{q}$ used was ideal and the use of a pseudo-random sequence results in a very high CMRR. The folding of quantization noise can be clearly seen for the case when ILA is not adopted (see dashed line in FIG. 8). With ILA (see dotted line in FIG. 8) no folding is present but it is possible to see the effect of the mixing of q with the input signal: a second order shaped spectrum is clearly visible corresponding to the second order shaping operated by the digital modulator of FIG. 7.

In the simulations the dependence of $g_{md}$ on the sequence q was exaggerated to clearly show its consequences. In a real system implementation the entity of the non-linearity must be evaluated to decide the opportunity of ILA calibration. The example shown in FIG. 8 is not a well designed system since the shaping of the calibration sequence must be increased and it should not be the limiting factor in the design. This shaping is operated in the digital modulator and is much cheaper in terms of power compared to consumption of analog circuits. In the performed simulations a second order shaping in the digital modulators and a third order shaping in the converter have been chosen in order to recognize the different effects in the spectra.

As it regards the use of two different digital modulators, especially in context of implementing ILA, as two sequences are needed with same average and spectra but different time waveforms, simply the output of one digital modulator and its delayed, i.e. time shifted, copy can be used. This has been proven to work and in the previous simulations this method was used to compute $q_0$ and $q_1$ from a single modulator.

Finally, the present invention has disclosed a circuit and a method for automatic common-mode rejection calibration in a differential conversion system and unbalance compensation for balancing the operation point of a circuit in the signal path and for enhancing the common-mode rejection. The circuit for automatic common-mode rejection calibration in a differential conversion system comprises an analog input stage for an analog input signal, an analog-digital-converter for converting an analog signal into its digital representation, a digital block arranged to adapt said digital representation of a portion of a DC offset of said analog input signal in accordance with whether said analog input signal is in a predetermined input range of said analog-digital-converter, and a digital-analog-converter arranged in a feedback path from said digital block to subtraction means of said analog input stage for converting a digital signal into an analog output signal, wherein said analog output signal is subtracted from said analog input signal resulting in said analog signal.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single circuit unit or other unit may fulfill the functions of several items recited in the claims. The mere fact that certain measures are recited in mutually different dependent claims does not indicate that a combination of these measured cannot be used to advantage.

Any reference signs in the claims should not be construed as limiting the scope.

The invention claimed is:

1. A circuit for automatic common-mode rejection calibration in a differential conversion system, comprising:
    an analog input stage for an analog input signal;
    an analog-digital-converter for converting an analog signal into its digital representation;
    a digital block arranged to adapt said digital representation of a portion of a DC offset of said analog input signal in accordance with whether said analog input signal is in a predetermined input range of said analog-digital-converter;
    a digital-analog-converter arranged in a feedback path from said digital block to a subtractor of said analog input stage for converting a digital signal into an analog output signal, wherein said analog output signal is subtracted from said analog input signal resulting in said analog signal; and
    a controller configured to switch said differential conversion system between at least two unbalanced states in accordance with a calibration signal.

2. Circuit according to claim 1,
    wherein said calibration signal has a higher frequency than a characteristic frequency of said differential conversion system.

3. Circuit according to claim 1,
    wherein said analog-digital-converter comprises a sigma-delta-converter.

4. Circuit according to claim 3,
    wherein said controller is arranged for setting said differential conversion system into at least one of a conversion mode and a calibration mode, and, after setting said differential conversion system in said calibration mode, for generating said calibration signal by using an output signal of said sigma-delta-converter as a calibration signal.

5. Circuit according to claim 4, further comprising:
    a generator for producing, in said calibration mode, two voltages $V_1$ and $V_2$ at differential input leads of said differential conversion system, such that:

$$V_1 = V_C + V_{dm,DC}/2 \text{ and } V_2 = V_C - V_{dm,DC}/2,$$

wherein $V_C$ is a predefined common-mode voltage level, equal to the DC voltage in common mode or to any other voltage level in the input common-mode range of said circuit, and $V_{dm,DC}$ is a DC component in differential mode of said differential conversion system, and wherein said two voltages correspond to said two unbalanced states in said differential conversion system, between which said differential conversion system is switched.

6. Circuit according to claim 1,
wherein said calibration signal is stored as a calibration sequence in a memory of said differential conversion system, and wherein said calibration sequence is read out from said memory for providing said calibration signal in conversion mode of said differential conversion system.

7. Circuit according to claim 1,
wherein said calibration signal is stored as a calibration sequence of finite length in a memory of said differential conversion system, and wherein said calibration sequence is periodically read out from said memory for providing said calibration signal in conversion mode of said differential conversion system.

8. Circuit according to claim 1,
wherein an average value of said calibration signal is stored as said calibration sequence in a memory of said differential conversion system, and said calibration signal is produced from said average value having said average value by an additional sigma-delta-modulator.

9. Circuit according to claim 8,
wherein said controller is arranged to extract said average value of said calibration signal by running said sigma-delta-converter as an incremental converter in said calibration mode and supplying the output of said sigma-delta-converter to a digital accumulator.

10. Circuit according to claim 8, further comprising:
a second additional sigma-delta-modulator, and wherein said controller is further arranged to produce said calibration signal from said average value by said additional sigma-delta-modulator together with said second additional sigma-delta-modulator, both using said average value as input signal, wherein in said conversion mode of said differential conversion system said calibration signal is comprised of an output of said additional sigma-delta-modulator and an output of said second additional sigma-delta-modulator by using an actual output of said differential conversion system for switching between said output of said additional sigma-delta-modulator and said output of said second additional sigma-delta-modulator.

11. Circuit according to claim 8,
wherein said controller is further arranged to produce said calibration signal from said average value by said additional sigma-delta-modulator, wherein in said conversion mode of said differential conversion system said calibration signal is comprised of an output of additional said sigma-delta-modulator and a time shifted version of said output of said additional sigma-delta-modulator by using an actual output of said differential conversion system for switching between said output of said additional sigma-delta-modulator and said time shifted version of said output of said additional sigma-delta-modulator.

12. Circuit according to claim 1,
wherein said calibration signal is a calibration bitstream.

13. Use of a circuit according to claim 1, for common-mode rejection and unbalance compensation in a biopotential acquisition front-end.

14. A method for automatic common-mode rejection calibration in a differential conversion system, said method comprising the steps:
converting an analog signal into its digital representation;
adapting said digital representation of a portion of a DC offset of said analog signal in accordance with whether said analog signal is in a predetermined input range of an analog-digital-converter and to compensating said DC offset;
converting said digital representation of said portion of said DC offset into an analog representation of said portion of said DC offset; and
subtracting said analog representation of said portion of said DC offset from an analog input signal resulting in said analog signal;
switching said differential conversion system between at least two unbalanced states using a calibration signal that is adapted such that a common-mode signal in the output of said differential conversion system is compensated by averaging.

15. Method according to claim 14, further comprising:
performing said switching using said calibration signal in accordance with a clock frequency higher than a characteristic frequency of said differential conversion system.

16. Method according claim 13, further comprising:
setting said differential conversion system into a calibration mode;
generating said calibration signal by using an output signal of said differential conversion system in calibration mode as calibration signal and storing said generated calibration signal as a calibration sequence.

17. Method according to claim 16, further comprising:
repeating said compensating of said DC offset and generating said calibration signal, if a predetermined change of said DC offset is detected.

18. Method according to claim 16,
wherein storing of said calibration sequence comprises storing of a portion of finite length of said calibration signal as calibration sequence; and
wherein generating said calibration signal comprises periodically repeating reading out of said portion of finite length of said calibration sequence from a memory.

19. Method according to claim 16, wherein storing of said calibration sequence comprises:
generating and storing an average value of said calibration signal as reference value for said calibration sequence; and
reproducing said calibration signal from said average value.

20. Method according to claim 14, further comprising:
balancing the operation point of said differential conversion system by modulating impedances at different points of said differential conversion system with said calibration signal.

* * * * *